US008299775B2

(12) United States Patent
Landis et al.

(10) Patent No.: US 8,299,775 B2
(45) Date of Patent: Oct. 30, 2012

(54) CURRENT-ALIGNED AUTO-GENERATED NON-EQUIAXIAL HOLE SHAPE FOR WIRING

(75) Inventors: Howard S. Landis, Underhill, VT (US); David Parker, South Burlington, VT (US); Jeanne-Tania Sucharitaves, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 1489 days.

(21) Appl. No.: 11/160,428

(22) Filed: Jun. 23, 2005

(65) Prior Publication Data

US 2006/0292855 A1 Dec. 28, 2006

(51) Int. Cl.
*G01R 19/00* (2006.01)
(52) U.S. Cl. ......................................... 324/66; 324/71.5
(58) Field of Classification Search .................. 324/522, 324/95, 76.11, 158.1; 257/758; 361/108; 716/11
See application file for complete search history.

(56) References Cited

U.S. PATENT DOCUMENTS

| | | | | |
|---|---|---|---|---|
| 5,289,036 A * | 2/1994 | Nishimoto | ..................... | 257/774 |
| 5,382,831 A * | 1/1995 | Atakov et al. | .................. | 257/767 |
| 5,689,139 A * | 11/1997 | Bui et al. | ....................... | 257/758 |
| 5,712,510 A | 1/1998 | Bui et al. | | |
| 6,191,481 B1 * | 2/2001 | Bothra et al. | .................. | 257/734 |
| 6,417,572 B1 * | 7/2002 | Chidambarrao et al. | ..... | 257/773 |
| 6,822,437 B1 | 11/2004 | Hau-Riege et al. | | |
| 6,828,223 B2 | 12/2004 | Chuang | | |
| 6,940,108 B2 * | 9/2005 | Cheng et al. | ................... | 257/211 |
| 7,089,522 B2 * | 8/2006 | Tan et al. | ......................... | 716/11 |
| 7,207,023 B2 * | 4/2007 | Yoshioka | ......................... | 716/10 |

FOREIGN PATENT DOCUMENTS

WO       WO 9710614 A1     11/1997

OTHER PUBLICATIONS

Blech, I.A., Electromigration in thin aluminum films on titanium nitride, J. App. Physics, V. 47, No. 4, Apr. 1976, p. 1203-1208.*
Cantwell, Brian T., Introduction to Symmetry Analysis, Cambridge University Press, 2002, p. 1-9.*
Savriama et al., "Geometric morphometrics of complex symmetric structures: Shape analysis of symmetry and asymmetry with Procrustes methods", Leeds, 2006, p. 158-161, www.maths.leeds.ac.uk/lasr2006/proceedings/savriama.pdf.*
Mentor Graphics, "Calibre Pattern Matching", Physical Verification datasheet, Jun. 2010, p. 1-2.*
Mentor Graphics, "Higher Education Program Product Brochure Jun. 2005", May 2, 2005, p. 1-40.*

* cited by examiner

*Primary Examiner* — Thomas Valone
(74) *Attorney, Agent, or Firm* — Anthony J. Canale; Hoffman Warnick LLC (57) ABSTRACT

A method, system and program product for replacing isotropic hole shapes in a wiring layout with non-equiaxial hole shapes that are arranged in a direction of current flow, which increases current flow along the wire's longitudinal axis while decreasing current flow along the wire's transverse axis. One aspect of the invention includes a method including determining a direction of electrical current flow in a portion of a wiring layout; and placing at least one non-equiaxial hole shape within the portion of the wiring layout, wherein the non-equiaxial hole shape is arranged in the direction of electrical current flow. The invention accommodates the limitations of copper CMP within an automated tool without sacrificing the efficiency of a hand-tuned layout. The invention also includes a semiconductor device including at least one non-equiaxial hole shape.

19 Claims, 10 Drawing Sheets

CURRENT-ALIGNED AUTO-GENERATED NON-EQUIAXIAL HOLE SHAPE FOR WIRING

BACKGROUND OF THE INVENTION

1. Technical Field

The present invention relates generally to semiconductor devices and more particularly to a method for optimizing the current-carrying and/or shielding capabilities of wide wires.

2. Related Art

In semiconductor applications, aluminum wires are often designed to be very wide, particularly in those instances where high current or electrical shielding is needed. Copper wires are favored over aluminum wires because of copper's higher conductivity and reliability. However, very wide copper wires are difficult to produce because the common manufacturing finishing process, i.e., chemical mechanical polishing (CMP), dishes the copper wire.

Two approaches have been taken to solve this problem: a) constraint of linewidths and pattern densities during circuit design, and b) filling of a fraction of the metal from the centers of very wide copper wires with dielectric studs, which is oftentimes referred to as 'cheesing'.

The first approach forces designers to grapple with the linewidth and pattern density limitations of copper CMP directly. Maximum linewidth and wide-line/wide-space rules combined with maximum local density rules require designers to manually adjust a large variety of high-current, sensitive, and/or analog circuits so as to avoid metallization layouts that are known to be unmanufacturable in copper. The specific limits of the manufacturing process and the form of these rules vary from generation to generation and from manufacturer to manufacturer. As a result, it is difficult for designers to both automate and optimize the layout of wide copper features. This approach is also problematic for semiconductor manufacturers because different customers often find very different ways to work around these constraints. One advantage of this approach, however, is that it is possible to obtain layouts that satisfy all of the constraints of copper CMP and maximize the current-carrying and/or shielding capability of the circuit.

The second approach shifts the burden of accommodating the limitations of the copper CMP process from the designers to an automation tool. There are a number of benefits to this approach: a designer can use a simple layout because linewidth and pattern-density limitations are largely or completely eliminated; the resulting layout is manufacturable and reliable; and the effects of the automated treatment on the final electrical behavior of the layout are straightforward and predictable. However, layouts resulting from this approach are less efficient than the hand-tuned layouts of the first approach. This inefficiency derives from the requirement that the automated treatments must be robust for all possible current flows through a circuit without any prior knowledge of the current vectors that are possible during operation of the semiconductor device. That is, the effect of the automated treatment must be completely or nearly isotropic with regard to current flow. For example, referring to FIG. 1, a prior art device 10 is shown comprising a copper wire 20 having a horizontal portion 22 and a vertical portion 24. Along a length of each portion 22, 24 are cut square equiaxial hole shapes 40. Hole shapes 40 are not placed where they would obstruct a non-redundant via, but may be allowed to impinge upon a via that is part of a large redundant array.

Figure 1:
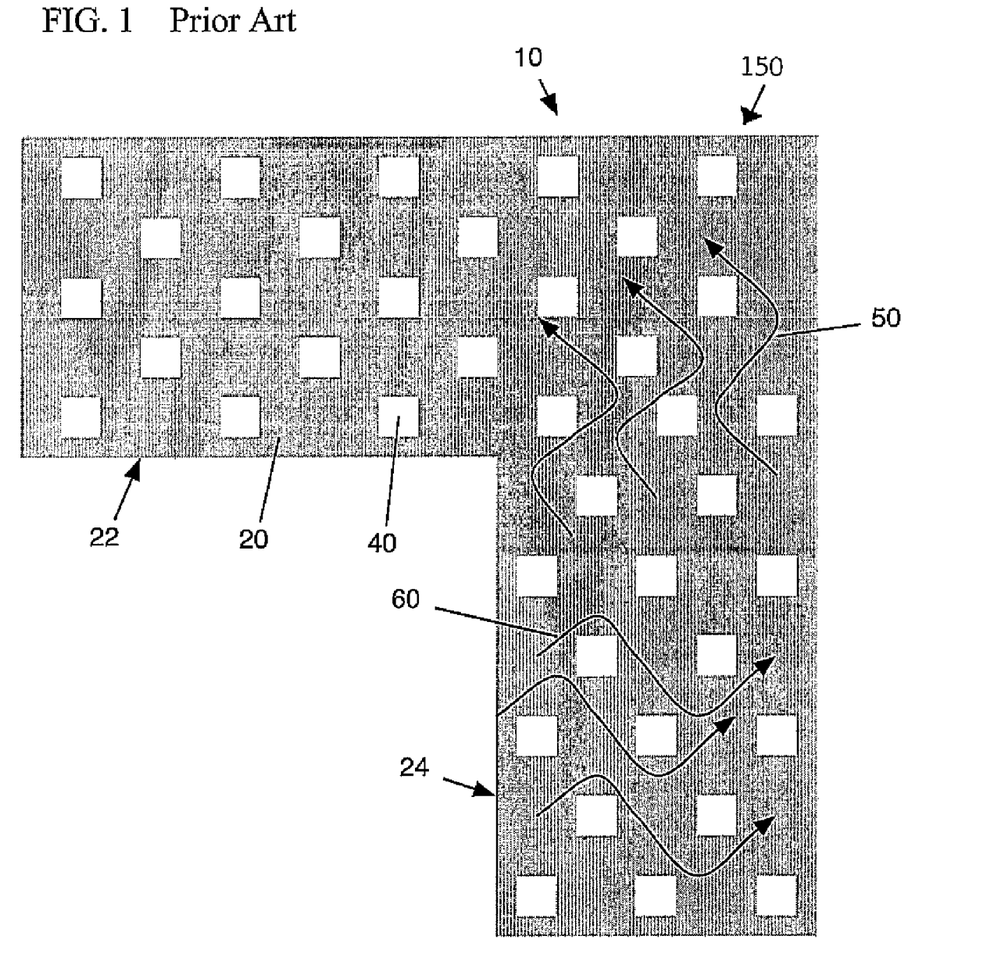
FIG. 1 is a schematic representation of a prior art device having equiaxial hole shapes.

Current flow in both a longitudinal direction 50 and a transverse direction 60 is decreased by "current crowding" (the need of current lines to bend around hole shapes 40), to approximately the same degree. That is, the effect of the automated treatment is isotropic with respect to current flow. Such an arrangement permits automated removal of portions of wire 20 without knowledge of any branching of or interconnects with wire 20. However, along longer uninterrupted and unbranched lengths of wire, the accommodation of current flow in the transverse direction is not only unnecessary, but undesirable.

In view of the foregoing, there is a need in the art for a method of providing hole shapes in wide copper wires that increases current flow along the wire's longitudinal axis while decreasing current flow along the wire's transverse axis.

SUMMARY OF THE INVENTION

The invention includes a method, system and program product for replacing isotropic hole shapes in a wiring layout with non-equiaxial hole shapes that are arranged in a direction of current flow, which increases current flow along the wire's longitudinal axis while decreasing current flow along the wire's transverse axis. One aspect of the invention includes a method including determining a direction of electrical current flow in a portion of a wiring layout; and replacing at least one substantially equiaxial hole shape with a non-equiaxial hole shape within the portion of the wiring layout, wherein the non-equiaxial hole shape is arranged in the direction of electrical current flow. The invention accommodates the limitations of copper CMP within an automated tool without sacrificing the efficiency of a hand-tuned layout. The invention also includes a semiconductor device including at least one non-equiaxial hole shape.

A first aspect of the present invention provides a method comprising: determining a direction of electrical current flow in a portion of a wiring layout; and replacing at least one previous substantially equiaxial hole shape with a non-equiaxial hole shape within the portion of the wiring layout, wherein the non-equiaxial hole shape is arranged in the direction of electrical current flow.

A second aspect of the present invention provides a system comprising: means for determining a direction of electrical current flow in a portion of the wiring layout; and means for replacing at least one previous substantially equiaxial hole shape with a non-equiaxial hole shape within the portion of the wiring layout, wherein the non-equiaxial hole shape is arranged in the direction of electrical current flow.

A third aspect of the present invention provides a computer program product comprising a computer readable medium having computer program code embodied therein, the program product comprising: program code for determining a direction of electrical current flow in a portion of the wiring layout; and program code for replacing at least one previous substantially equiaxial hole shape with a non-equiaxial hole shape within the portion of the wiring layout, wherein the non-equiaxial hole shape is arranged in the direction of electrical current flow.

A fourth aspect of the invention includes a semiconductor device comprising: a metal wiring portion including at least one non-equiaxial hole shape.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 2:
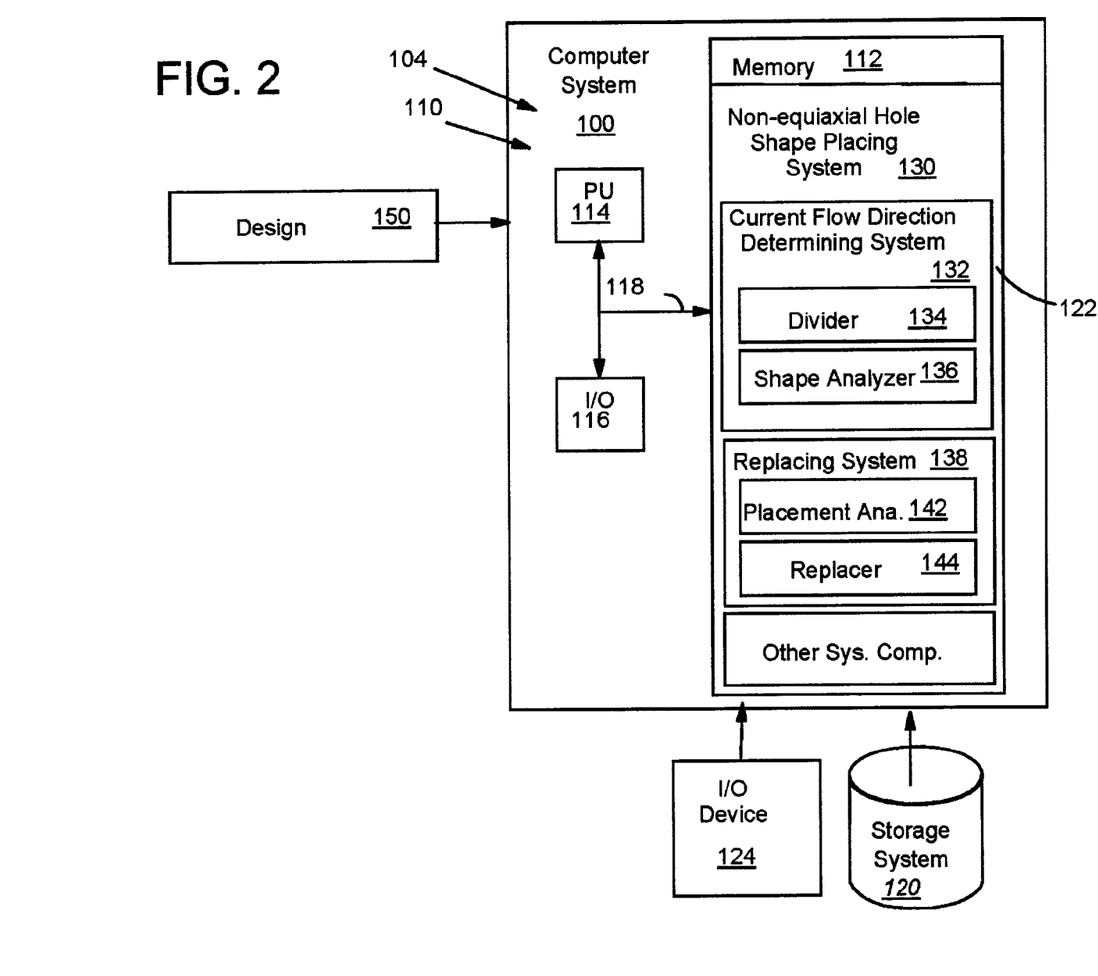
FIG. 2 is a block diagram of a system for placing non-equiaxial hole shapes in a wiring layout according to the invention.

Referring to FIG. 2, a block diagram of a computer system 100 capable of placing at least one non-equiaxial hole shape in a wiring layout in accordance with the 112, a processor 114, an input/output (I/O) interface 116, and a bus 118. Computing device 110 is shown in communication with an external I/O device/resource 124 and a storage system 120, which together comprise a computer infrastructure 104. As is known in the art, in general, processor 114 executes computer program code such as a non-equiaxial hole shape placing system 130, that is stored in memory 112 and/or storage system 120. While executing computer program code, processor 114 can read and/or write data, such as that of hole shape placing system 130, to/from memory 112, storage system 120, and/or I/O interface 116. Bus 118 provides a communication link between each of the components in computing device 110. I/O device 124 may comprise any known type of device that enables a user to interact with computing device 110 or any device that enables computing device 110 to communicate with one or more other computing devices, including a network system, modem, keyboard, mouse, scanner, voice recognition system, CRT, printer, disc drive, etc. Additional components, such as cache memory, communication systems, system software, etc., may also be incorporated into system 100.

In any event, computing device 110 can comprise any general purpose computing article of manufacture capable of executing computer program code installed by a user (e.g., a personal computer, server, handheld device, etc.). However, it is understood that computing device 110 is only representative of various possible computing devices that may perform the various process steps of the invention. To this extent, in other embodiments, computing device 110 can comprise any specific purpose computing article of manufacture comprising hardware and/or computer program code for specific functions, any computing article of manufacture that comprises a combination of specific purpose and general purpose hardware/software, or the like. In each case, the program code and hardware can be created using standard programming and engineering techniques, respectively.

Similarly, computer system 100 is only illustrative of various types of systems for implementing the invention. For example, in one embodiment, system 100 comprises two or more computing devices (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.).

As previously mentioned, non-equiaxial hole shape placing system 130 enables computing device 110 to place at least one non-equiaxial hole shape in a wiring layout. To this extent, system 130 is shown including a determining system 132 having a divider 134 and shape analyzer 136, and a replacing system 138 including a placement analyzer 142 and a replacer 144. It should be understood that some of the various systems of FIG. 2 can be implemented independently, combined, and/or stored in memory for one or more separate computing devices 110 that communicate over a network. Further, it should be understood that some of the systems and/or functionality may not be implemented, or additional systems and/or functionality may be included as part of system 100.

Figure 3:
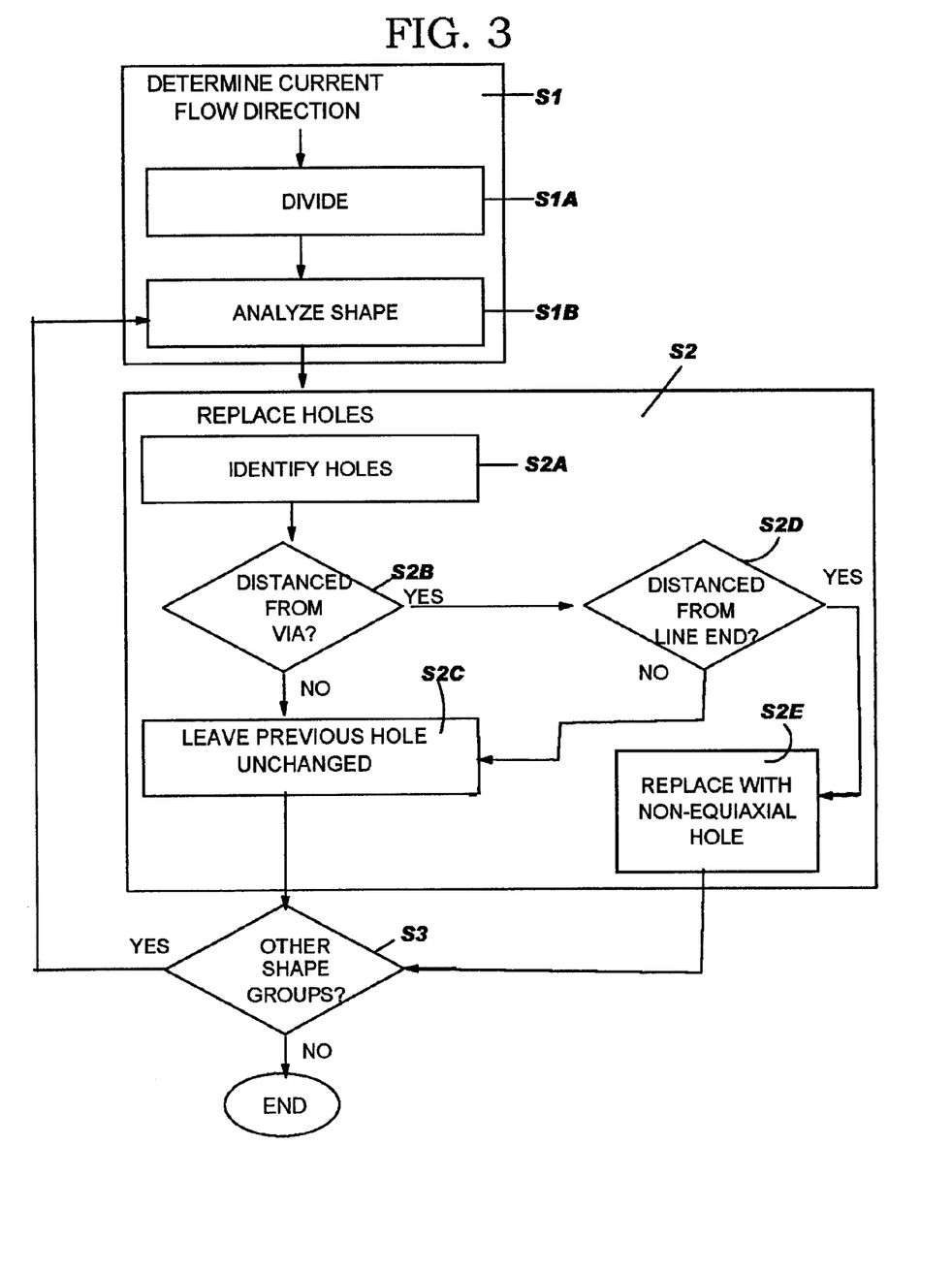
FIG. 3 is a flow diagram of a method of placing non-equiaxial hole shapes in a wiring layout according to the invention.

Turning to FIG. 3, a flow diagram is shown depicting a method of operation of non-equiaxial hole shape placing system 130 for replacing substantially equiaxial hole shapes in a wiring layout, i.e., an electronic representation of a wiring structure.

First, at step S1, current direction determining system 132 determines a direction of electrical current flow in a portion of wiring layout 150 (FIG. 1). In one embodiment, this step may include sub-step S1A in which divider 134 of determining system 132 divides metal features of wiring layout 150 (FIG. 1) into geometric shape groups. One preferred geometric shape group is wiring layout direction. For example, wiring layout direction groups can be divided by orthogonal directions in which wiring structures extend such as a first direction and a second direction orthogonal to the first direction. In this case, wiring layout 150 may be divided into rectangles extending in one of the particular directions. Wiring layout 150 (FIG. 1) may also be divided into other geometric shape groups such as 45° rectangles and trapezoids. All such divisions should tend to minimize cut-lengths so as to generate the most simple collection of shapes. In any event, sub-step S1B includes shape analyzer 136 analyzing a portion of wiring layout 150, e.g., a particular geometric shape group or larger portion, to determine the electrical current direction flow. For a long section of wire (length>>width) with no branches or connections, it can be assumed that all current flow will be along the length of the wire and no current flow will occur in the transverse direction. Accordingly, since many portions of a typical wiring layout 150 can be categorized as a long section, a current flow direction for many portions can be determined by analyzing which is a long section. In sections of a wiring layout for which the direction of current flow cannot be so determined, equiaxial hole shapes would be retained in order to ensure that the true current flow is not inappropriately inhibited by wrong-way slotting.

Next, in step S2, replacing system 138 places at least one non-equiaxial hole shape within the portion of wiring layout 150 in a direction of electrical current flow. In particular, placement analyzer 142 determines whether one or more equiaxial previous hole shape in wiring layout should be replaced with a non-equiaxial hole shape. For example, substantially equiaxial hole shapes lying within rectangles configured in the first direction, e.g., horizontal are identified at step S2. In step S2A, placement analyzer 142 identifies 'previous hole shapes' in wiring layout 150, which include substantially equiaxial hole shapes that have been inserted previously in any now known or later developed fashion. At step S2B, placement analyzer 142 determines whether each previous hole shape is sufficiently distant from a via. If it is determined that the previous hole shape is not sufficiently distant from a via, i.e., NO at step S2B, then the previous hole shape is left unchanged at step S2C. If it is determined that the previous hole shape is sufficiently distant from a via, then placement analyzer 150 determines at step S2D whether the previous hole shape is sufficiently distant from a 'line end', which includes macroscopic line ends as well as line ends that connect an edge of the portion in question. If it is determined that the previous hole shape is not sufficiently distant from a line end, the previous hole shape is left unchanged at step S2C. If it is determined that the previous hole shape is sufficiently distant from a line end, then replacer 144 replaces the previous hole shape at step S2E with a non-equiaxial hole shape, as will be described in further detail below.

Via step S3, the process may be repeated for hole shapes lying within second direction rectangles, replacing those, as appropriate, with second direction non-equiaxial hole shapes, e.g., extended slots. The process may also be similarly repeated for hole shapes lying within 45° rectangles and trapezoids, replacing the previous hole shapes, as appropriate, with extended slots aligned with the direction of current flow of the portion.

Figure 4:
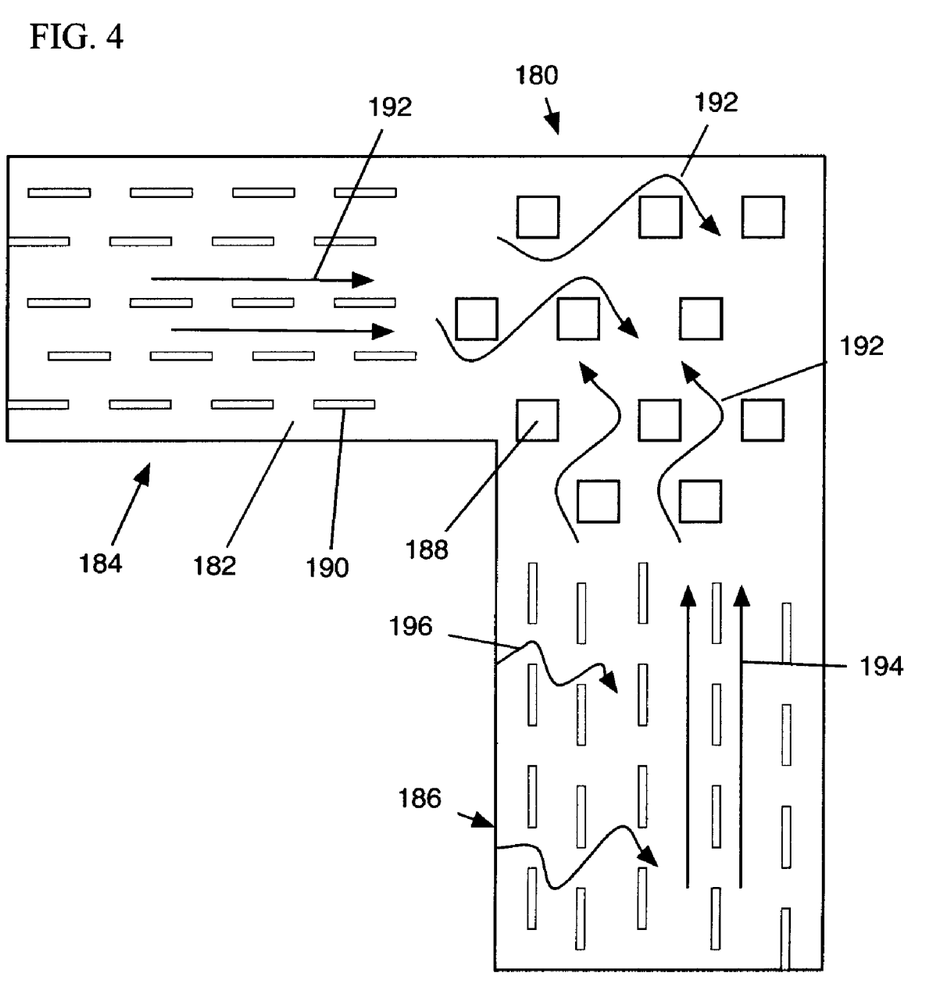
FIG. 4 is schematic representation of a device of the invention having elongated hole shapes in a portion of the copper wire.

Turning to FIGS. 4-9C, different non-equiaxial hole shape implementations will now be described. Referring to FIG. 4, a device 180 is shown comprising a wide copper wire 182 having horizontal 184 and vertical 186 portions. As in FIG. 1, a number of previous substantially equiaxial hole shapes 188 have been made in an area where horizontal 184 and vertical 186 portions meet. However, unlike the device of FIG. 1, non-equiaxial hole shapes 190 in the form of extended slots have been made along a length of wire portion 184 where wire portion 184 is uninterrupted by branching or another wire. Extended slots 190 permit less restricted current flow in a longitudinal direction 192, 194 and a more restricted flow in a transverse direction 196. That is, along the length of wire portion 182, where current flow is ideally unrestricted, the use of extended slots 190 increases effective conductance and decreases current crowding, as compared to known devices, such as that of FIG. 1. Similarly, along the width of wire portion 182, where current flow is ideally eliminated, the use of extended slots 190 decreases effective conductance and increases current crowding. Where horizontal portion 182 and vertical portion 184 meet, however, elongated slots would undesirably restrict longitudinal current flow in one or both portions. Accordingly, in branched areas of wire portion 182 or where wire portions interconnect, current flow should remain isotropic. In such areas, therefore, previous substantially equiaxial hole shapes 188 should still be employed to permit current flow in each portion 184, 186 in as unrestricted a manner as possible.

Figure 5:
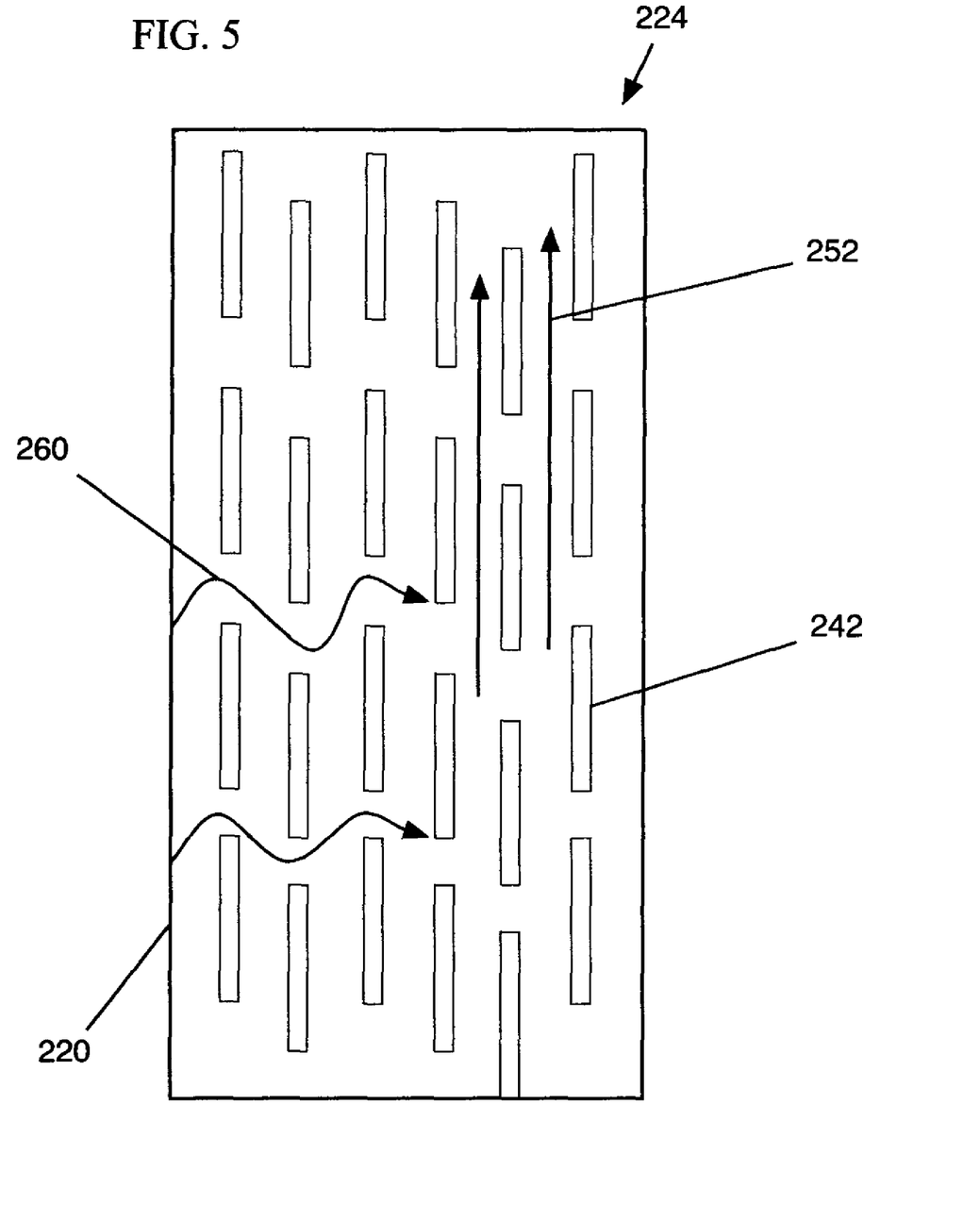
FIG. 5 is a detailed view of a portion of the device of FIG. 4.

FIG. 5 shows a vertical portion 224 of the device of FIG. 4 in greater detail. As can be seen, extended slots 242 permit relatively unrestricted current flow in a longitudinal direction 252 but significantly more restricted flow in a transverse direction 260, as compared to the prior art device of FIG. 1.

Figure 6:
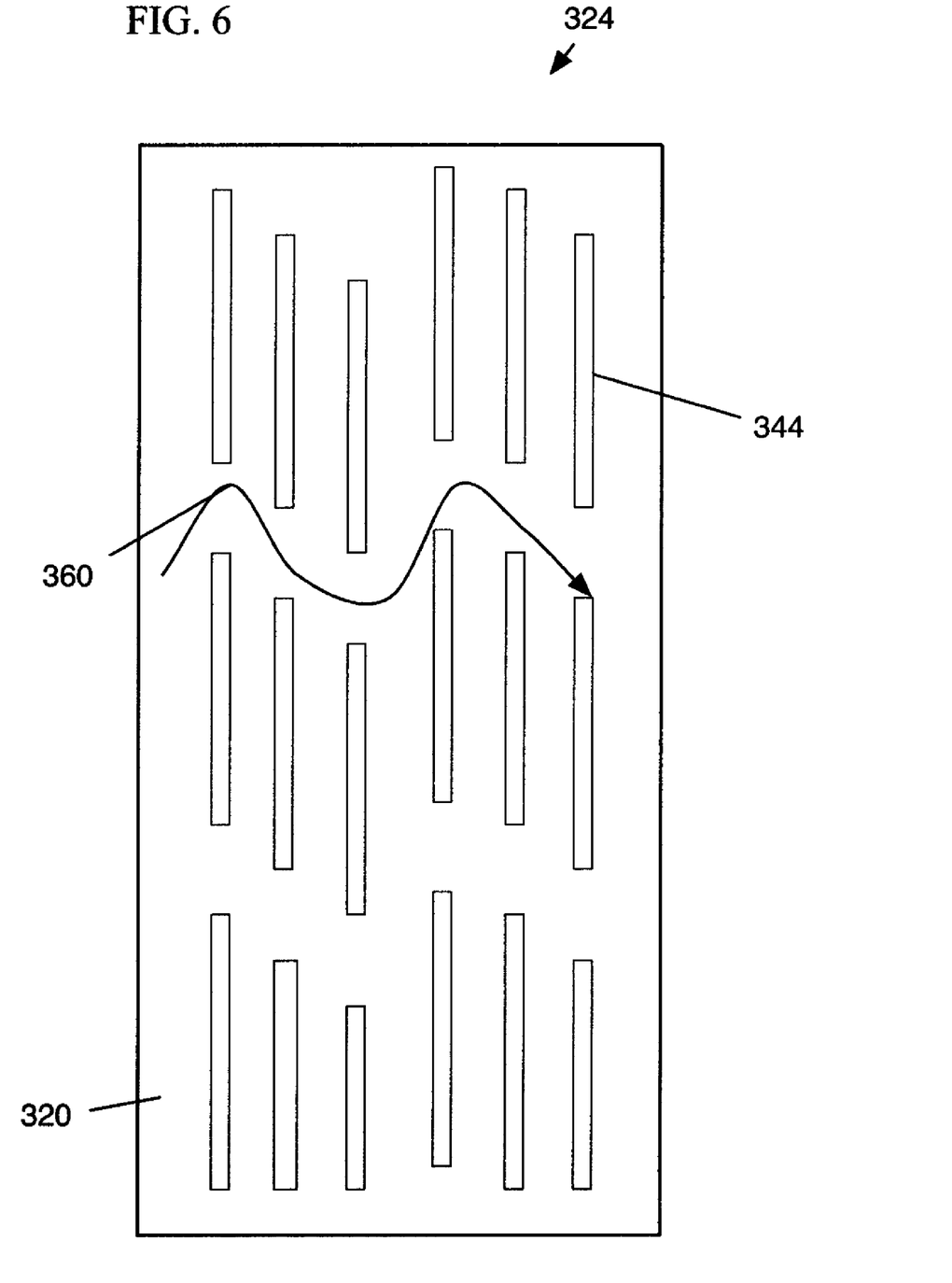
FIG. 6 is a detailed view of a portion of an alternate embodiment of the device of FIG. 4.

Referring now to FIG. 6, an alternate embodiment of the present invention is shown, wherein every n out of m previous substantially equiaxial hole shapes (where n<m) have been replaced by non-equiaxial hole shapes in the form of long extended slots 344 and the remaining portion (m−n) of the previous substantially equiaxial hole shapes have been removed entirely. The effect is a larger effective conductance in a longitudinal direction due, in part, to the greater crowding effect of transverse current flow 360. Because of this more severe penalty for transverse current flow 360, long extended slots 344 must be placed further away from disruptive features such as branch points and vias.

Figure 7:
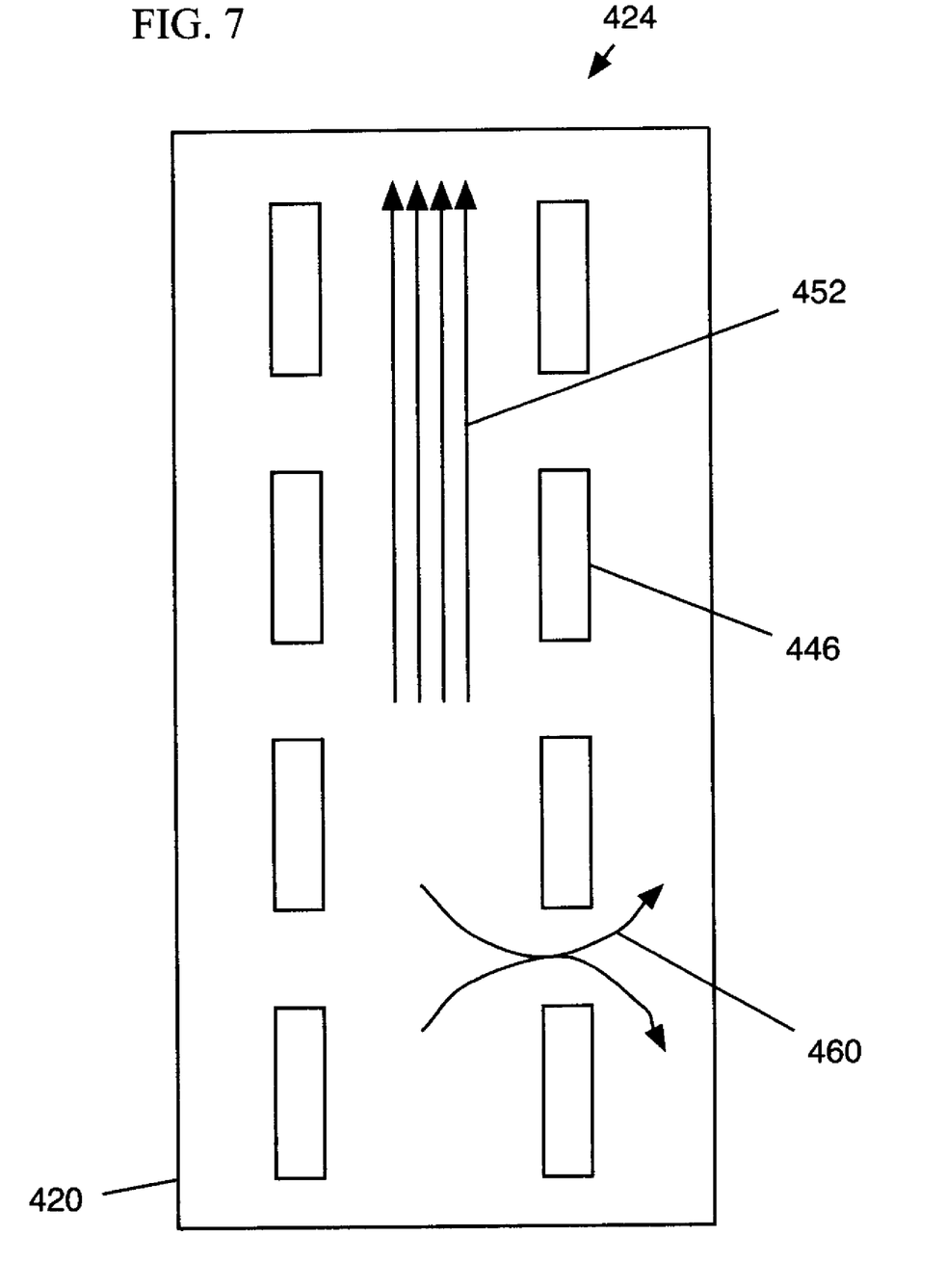
FIG. 7 is a detailed view of a portion of another alternate embodiment of the device of FIG. 4.

Another alternate embodiment of the present invention is shown in FIG. 7. Here, it is possible to utilize non-equiaxial hole shapes in the form of wide and long extended slots 446 in a very wide wire 420. As used herein, 'wide' indicates a slot that is significantly wider than the narrowest enclosed opening allowed for a given technology (e.g., 0.14 µm for 90 nm technology). This is in contrast to the previously-described slots, which are intended to be as narrow or nearly as narrow as the smallest enclosed opening allowed for a given technology. Similar to the embodiment of FIG. 6, a wide and long extended slot 446 may be substituted for one of every m previous substantially equiaxial hole shapes and the remaining hole shapes (m−1) removed entirely. In this embodiment, the process window for copper CMP is improved relative to the devices in FIGS. 4 and 6. In addition, longitudinal current flow 452 is greatly enhanced and transverse current flow 460 greatly impaired. Because of this more severe penalty for transverse current flow, wide and long extended slots 446 must be placed quite far away from disruptive features such as branch points and vias. As such, wide and long extended slots 446 are most appropriate for the centers of very wide wires. It is possible, therefore, to combine the benefits of the embodiments shown in FIGS. 6 and 7. For example, previous substantially equiaxial hole shapes may be replaced by long extended slots 344 (FIG. 6) near a line edge or disruptive element and by the more efficient wide and long extended slots 446 (FIG. 7) in areas sufficiently far from a line edge or disruptive element.

Figure 8A:
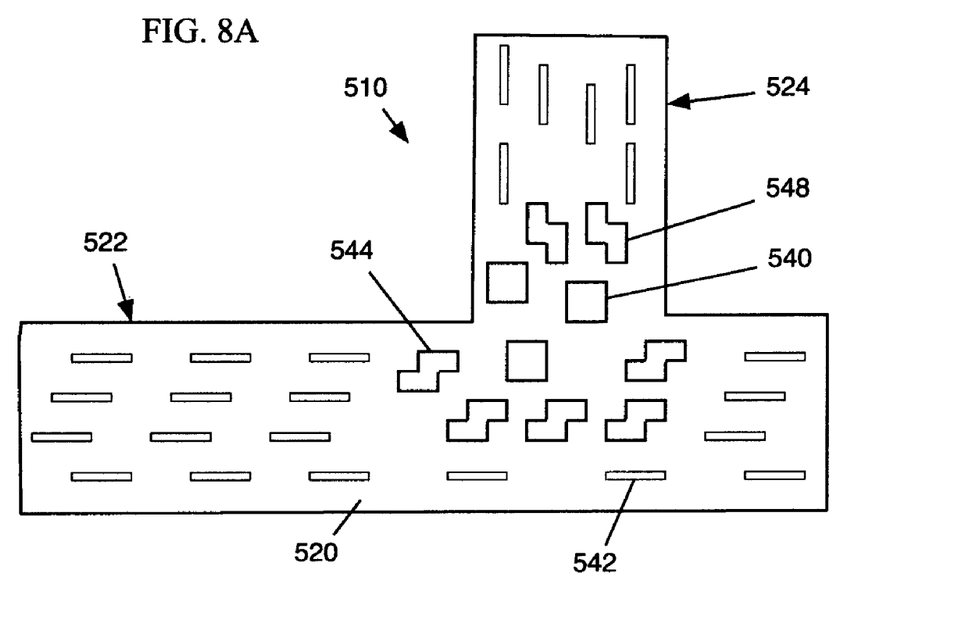
FIGS. 8A-B are schematic representations of devices of the invention having transitional non-equiaxial hole shapes.
Figure 8B:
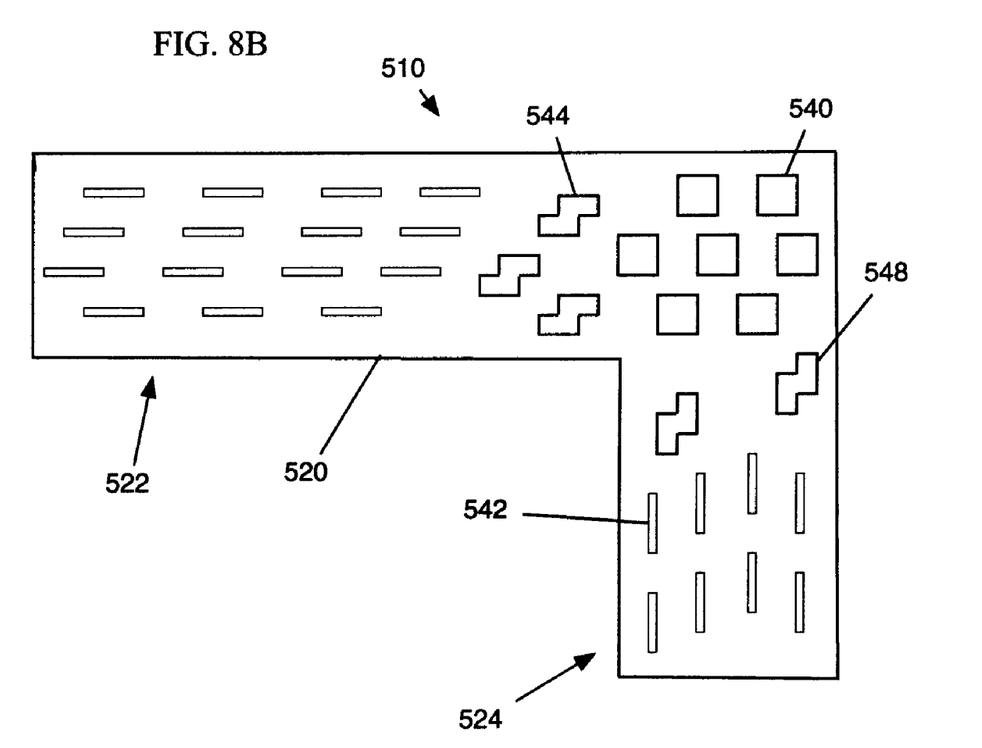

Referring now to FIGS. 8A-B, another alternate embodiment of the present invention is shown. Here, non-equiaxial hole shapes in the form of semi-directional slots 548 are employed in regions of different current flow direction in order to create a more uniform metal density in such regions. Semi-directional slots 548 comprise elongate hole shapes oriented in each of the directions of current flow and are meant to transition between the elongate and previous substantially equiaxial hole shapes 540. These semi-directional slots 548 increase current crowding only slightly while producing much more uniform metal density. The penalty for transverse current flow through semi-directional slots 548 is minor when used in regions of different current flow direction. By way of comparison, if semi-directional slots 548 were used throughout the body of a wire portion with well-defined directionality, the current crowding would be intermediate between that of previous substantially equiaxial hole shapes 40 of FIG. 1 and extended slots 190 of FIG. 4.

Figure 9A:
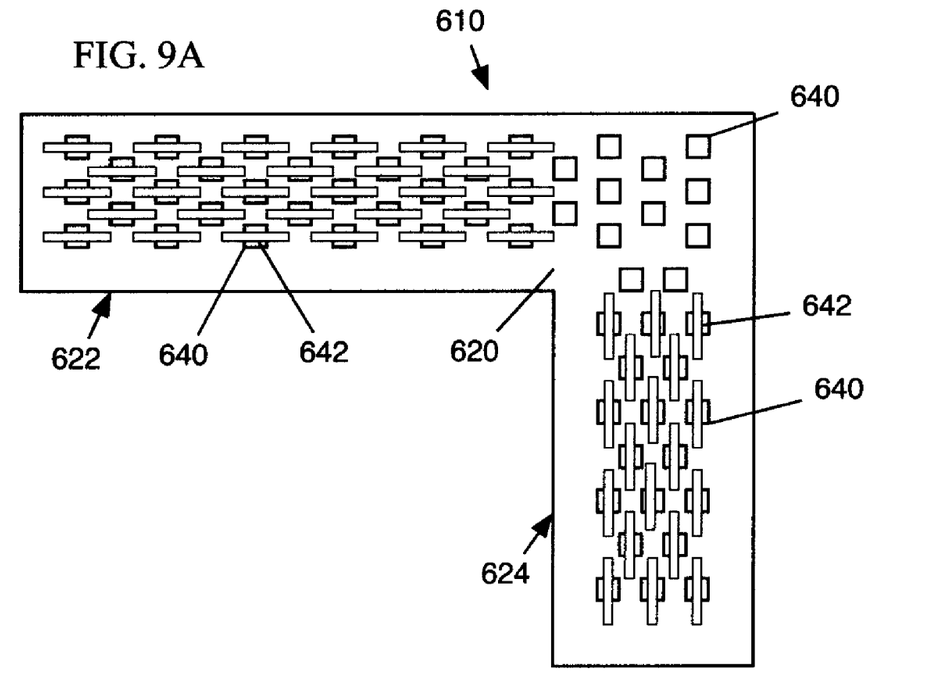
FIGS. 9A-C are schematic representations showing the addition of non-equiaxial, elongated hole shapes to a wiring layout having extant equiaxial hole shapes.
Figure 9B:
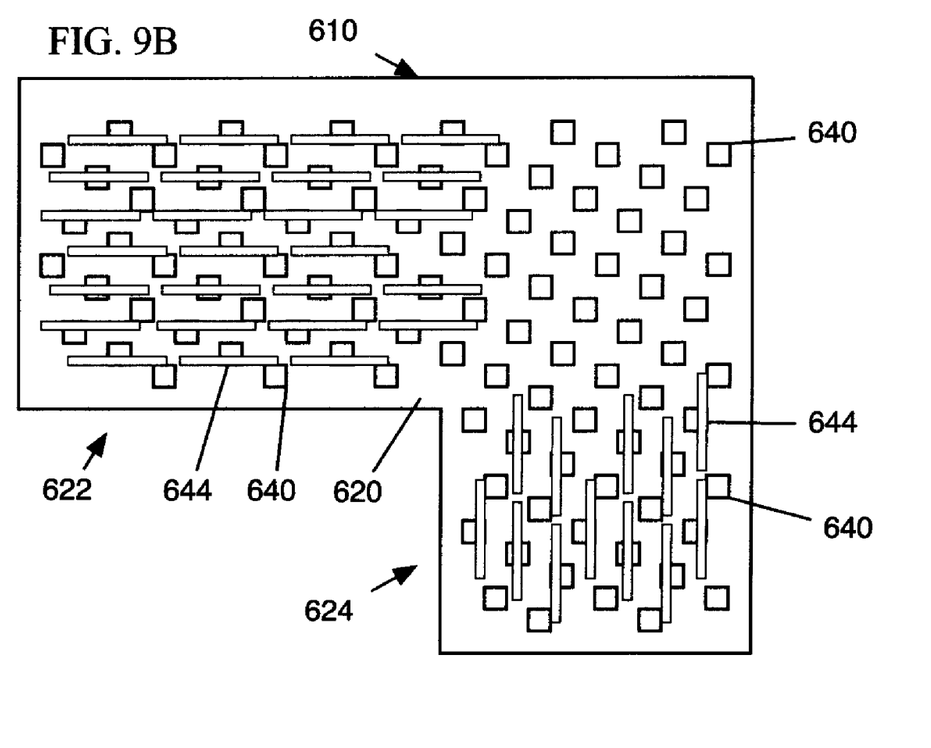
Figure 9C:
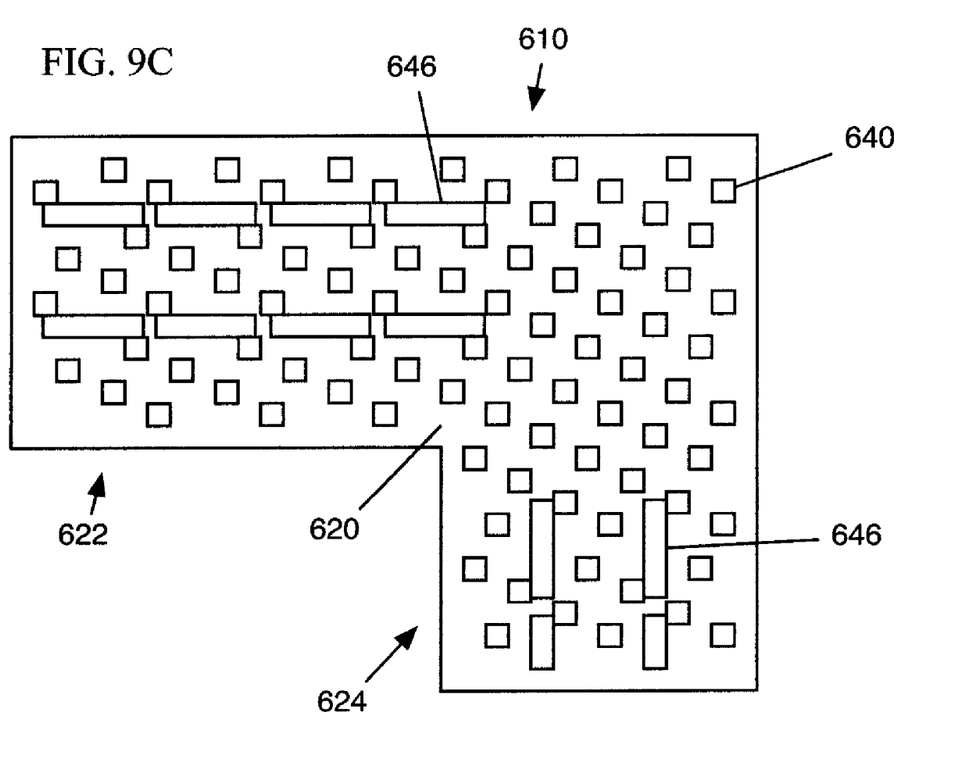

FIGS. 9A-C show how it is possible to derive the proper locations of extended slots 190 (FIG. 4), long extended slots 344 (FIG. 6) and wide and long extended slots 446 (FIG. 7) from the locations of previous substantially equiaxial hole shapes 40 (FIG. 1) in existing wire layouts. The only additional information required is the directionality of current flow for each line segment. In the absence of vias and side-branches, this directionality only depends on the macroscopic directionality of the line itself, as described above with reference to the flow diagram of FIG. 3. Referring to FIG. 9A, in the absence of vias and side-branches, extended slots 642 have been substituted one-to-one for previous substantially equiaxial hole shapes 640. In FIG. 9B, long extended slots 644 have similarly been substituted for some of the previous substantially equiaxial hole shapes 640. Specifically, a long extended slot 644 has been substituted for three of the five substantially equiaxial hole shapes 640 making up each repeating unit of five previous substantially equiaxial hole shapes. In FIG. 9C, wide and long extended slots 646 have been substituted for one of the five previous substantially equiaxial hole shapes 640 making up each unit of five previous substantially equiaxial hole shapes. Here, it may also be necessary to evaluate the widths of horizontal portion 622 and vertical portion 624 to ensure that the use of wide and long extended slots 646 is appropriate, as explained above.

The present invention provides significant improvements in the conductivity and/or shielding of wide wire portions as compared to methods known in the art. Known methods typically carry an approximately 50% conductivity penalty for the removal of wire mass. For example, using a method comprising the placing only of substantially equiaxial hole shapes, such as that shown in FIG. 1, wherein approximately 20% of the total wire mass is removed, the wire's conductivity is typically reduced by approximately 30%. That is, the reduction in conductivity is approximately 50% greater than the percentage of mass removed. However, using a method of the present invention, the penalty is reduced to approximately zero. That is, the removal of the same approximately 20% of wire mass reduces the wire's conductivity by an approximately equal amount, i.e., approximately 20%.

While shown and described herein as a method and system for placing non-equiaxial hole shapes in a wiring layout, it is understood that the invention further provides various alternative embodiments. For example, in one embodiment, the invention provides a computer-readable medium that includes computer program code to enable a computer infrastructure to place non-equiaxial hole shapes in a wiring layout. To this extent, the computer-readable medium includes program code, such as system 130, that implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 112 and/or storage system 120 (e.g., a fixed disk, a read-only memory, a random access memory, a cache memory, etc.), and/or as a data signal traveling over a network (e.g., during a wired/wireless electronic distribution of the program code).

In still another embodiment, the invention provides a method for generating a system for placing hole shapes in a wiring layout. In this case, a computer infrastructure, such as computer infrastructure 104, can be obtained (e.g., created, maintained, having been made available to, etc.) and one or more systems for replacing the process steps of the invention can be obtained (e.g., created, purchased, used, modified, etc.) and deployed to the computer infrastructure. To this extent, the deployment of each system can comprise one or more of (1) installing program code on a computing device, such as computing device 110, from a computer-readable medium; (2) adding one or more computing devices to the computer infrastructure; and (3) incorporating and/or modifying one or more existing systems of the computer infrastructure to enable the computer infrastructure to perform the process steps of the invention.

As used herein, it should be understood that the terms "program code" and "computer program code" are synonymous and mean any expression, in any language, code, or notation, of a set of instructions intended to cause a computing device having an information processing capability to perform a particular function either directly or after either or both of the following: (a) conversion to another language, code, or notation; and/or (b) reproduction in a different material form. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method comprising:
   determining a direction of electrical current flow in a portion of a wiring layout including at least one substantially equiaxial hole shape; and
   optimizing the wiring layout by replacing the at least one substantially equiaxial hole shape with a non-equiaxial hole shape within the portion of the wiring layout, wherein the non-equiaxial hole shape is arranged in the direction of electrical current flow; and
   outputting the optimized wiring layout for manufacturing an integrated circuit based on the optimized wiring layout;
   wherein the determining includes determining a geometric shape of the portion of the wiring layout.

2. The method of claim 1, wherein the replacing step reduces current crowding in the direction of electrical current flow compared to a level of current crowding before the replacing step.

3. The method of claim 1, wherein the replacing step increases current crowding in a direction transverse to the direction of electrical current flow compared to a level of current crowding before the replacing step.

4. The method of claim 1, wherein the geometric shape is at least one of a first direction rectangle, a second direction rectangle, a 45° rectangle or a trapezoid.

5. The method of claim 1, wherein the at least one non-equiaxial hole shape is selected from a group consisting of an extended slot, a long extended slot, and a wide and long extended slot.

6. The method of claim 1, further comprising leaving a previous substantially equiaxial hole shape in the case that the previous substantially equiaxial hole shape is located near at least one of a via and a line end.

7. The method of claim 1, wherein the replacing step includes replacing the previous substantially equiaxial hole shape with at least one of an extended slot shape, a long extended slot shape, or a wide and long extended slot shape in the case that the previous substantially equiaxial hole shape is not located near a via or a line end.

8. The method of claim 1, wherein the wiring layout includes copper.

9. The method of claim 1, wherein a conductivity penalty is less than 50%.

10. The method of claim 9, wherein the conductivity penalty is approximately zero.

11. A system comprising:
    means for determining a direction of electrical current flow in a portion of the wiring layout including at least one substantially equiaxial hole shape, wherein the determining means includes means for determining at least one geometric shape of the wiring layout; and means for replacing the at least one substantially equiaxial hole shape with a non-equiaxial hole shape within the portion of the wiring layout, wherein the non-equiaxial hole shape is arranged in the direction of electrical current flow.

12. The system of claim 11, wherein the replacing means results in at least one of a reduced current crowding in the direction of electrical current flow or an increased current crowding in a direction transverse to the direction of electrical current flow.

13. The system of claim 11, wherein the geometric shape is selected from a group consisting of a first direction rectangle, a second direction rectangle, a 45° rectangle, and a trapezoid.

14. The system of claim 11, wherein the at least one non-equiaxial hole shape is selected from a group consisting of an extended slot shape, a long extended slot shape, and a wide and long extended slot shape.

15. The system of claim 11, wherein the wiring layout includes copper.

16. The system of claim 11, wherein a conductivity penalty is less than 50%.

17. A computer program product comprising a computer readable medium having computer program code embodied therein, the program product comprising:
program code for determining a direction of electrical current flow in a portion of the wiring layout including at least one substantially equiaxial hole shape, wherein the determining code includes program code for determining at least one geometric shape of the wiring layout;
and program code for replacing the at least one substantially equiaxial hole shape with a non-equiaxial hole shape within the portion of the wiring layout, wherein the non-equiaxial hole shape is arranged in the direction of electrical current flow.

18. The program product of claim 17, wherein the at least one non-equiaxial hole shape is selected from a group consisting of an extended slot shape, a long extended slot shape, and a wide and long extended slot shape.

19. The program product of claim 17, wherein the geometric shape is selected from a group consisting of a first direction rectangle, a second direction rectangle, a 45° rectangle, and a trapezoid.

* * * * *